United States Patent [19]

Katz et al.

[11] Patent Number: 5,015,965

[45] Date of Patent: May 14, 1991

[54] PREDISTORTION EQUALIZER WITH RESISTIVE COMBINERS AND DIVIDERS

[75] Inventors: Allen Katz, Trenton; Robert R. Urban, Englishtown, both of N.J.

[73] Assignee: General Electric Company, East Windsor, N.J.

[21] Appl. No.: 440,580

[22] Filed: Nov. 22, 1989

[51] Int. Cl.⁵ .............................................. H03F 1/26
[52] U.S. Cl. .................................... 330/149; 330/295
[58] Field of Search ............... 307/491; 328/162; 330/84, 110, 107, 124 D, 124 R, 149, 151, 295; 333/130

[56] References Cited

U.S. PATENT DOCUMENTS

| | | | |
|---|---|---|---|
| 3,223,940 | 12/1965 | Early et al. | 330/124 D |
| 3,971,993 | 7/1976 | Constant | 330/149 X |
| 4,010,426 | 3/1977 | Rambo | 330/124 D X |
| 4,109,212 | 8/1978 | Donnell et al. | 333/14 X |
| 4,329,655 | 5/1982 | Nojima | 330/149 |
| 4,430,619 | 2/1984 | Epsom et al. | 330/149 |
| 4,465,980 | 8/1984 | Huang et al. | 330/149 |
| 4,588,958 | 5/1986 | Katz | 330/149 |

FOREIGN PATENT DOCUMENTS

56-83104  7/1981  Japan ................................. 330/149

OTHER PUBLICATIONS

"Universally Applicable Technique Linearizes Microwave Power Amplitudes", by Gosch, published at pp. 82 and 84 of the Sep. 11, 1980 issue of Electronics magazine.

"Predistortion Nonlinear Compensation for Microwave SSB-AM System", by Nojima et al., published in The Proceedings of ICC80, The 1980 International Conference on Communications, Seattle, Wash., 8-12 Jun. 1980.

"Linearization Techniques for Travelling Wave Tube and Solid State Power Amplifiers", by Kumar published by RCA David Sarnoff Research Center.

*Primary Examiner*—Steven Mottola
*Attorney, Agent, or Firm*—William H. Meise

[57] ABSTRACT

A predistortion equalizer for a power amplifier includes a linear channel and a nonlinear channel. A phase shifter is associated with the linear channel and an attenuator is associated with the nonlinear channel. A resistive power divider divides the received signal which is to be predistorted and divides it into two parts, each of which is applied to one of the channels. The two parts may be equal in magnitude. The linear and nonlinear signals at the outputs of the linear and nonlinear channels, respectively, are combined out-of-phase in a resistive combiner to produce a predistorted signal for application to a power amplifier. The resistive combiner and divider maximize bandwidth.

14 Claims, 4 Drawing Sheets

PREDISTORTION EQUALIZER WITH RESISTIVE COMBINERS AND DIVIDERS

This invention relates to predistortion circuits for compensating amplitude and phase distortion of power amplifiers, and especially to radio-frequency predistortion equalizers in which the signal is split, passed through plural separate channels, and recombined.

Electronic signal amplifiers are used to increase a voltage, current or power of electrical signals. Ideally, amplifiers merely increase the signal amplitude without affecting the signal in any other way. However, all signal amplifiers distort the signal being amplified. The distortion results from nonlinearity of the transfer function or characteristic of the active devices of the amplifier. The distortion of a signal passing through an amplifier can be reduced by keeping the peak-to-peak signal amplitude small, and by operating the amplifier so that the signal traverses the central part of its transfer characteristic, at which it is most linear. However, there are certain situations in which it is necessary for the output signal excursion to extend over a substantial part of the amplifier transfer function. This is true in the case of radio and television broadcast transmitters, where such operation is important in order to obtain the maximum possible output power from each costly amplifier. This condition also exists in the case of microwave or millimeter-wave frequency (Radio Frequency or RF) amplifiers for satellite communications, because the ability of the active devices to operate at RF requires a structure which allows them to be operated only at relatively moderate voltage and current bias levels, so that the signal swing constitutes a significant portion of the available bias, and therefore of the overall transfer function of the amplifier. When the output signal swing of an amplifier makes excursions over substantial portions of the transfer function, the usual effect is a relative compression of large signals by comparison with small signals, i.e. the gain of the amplifier at large signal levels tends to be less than the gain at low signal levels. For the case of a sinusoidal signal, the compressed output signal is a sinusoid generally similar in appearance to the input signal, but with a somewhat flattened top and bottom. Radio frequency amplifiers are often used to amplify a plurality of signals, as in multichannel satellite operations. When multiple signals are amplified, the peak signal values of the plural signals occasionally become superposed, causing sum excursions with large peak-to-peak values. In the case of multichannel signals, compression may not be as easy a measurement to make as measurement of corresponding manifestations of the distortion such as intermodulation distortion. Intermodulation distortion measurements are ordinarily made by measuring the relative amount of unwanted products which accompany one of the carriers, which for test purposes is generally itself unmodulated.

Predistortion of the signal applied to a nonlinear amplifier in order to precompensate for the expected distortion caused by the amplifier's nonlinearity is well known in the art. Among the problems which arise in the design of predistortion circuits are that of finding a nonlinear device which has a gain which increases with increasing level, and which will therefore compensate for the decrease in gain caused by the amplifier nonlinearity. The type of nonlinear device may depend on the circuit topology. One prior art arrangement is the reflective linearizer described in U.S. Pat. No. 4,588,958 issued May 13, 1986 to Katz, which uses an antiparallel diode pair. Another problem lies in the matching of the nonlinearity of the nonlinear device to that of the amplifier both in amplitude and in phase. That is, the increase in gain with increasing signal level due to predistortion must substantially match the decrease in gain with increasing level attributable to the amplifier. In the case of power amplifiers handling a plurality of channels extending over a relatively wide frequency band, a further problem lies in causing the bandwidth of the predistortion equalizer to equal that of the amplifier which it predistorts. If the predistortion circuit introduces more distortion than it compensates at many frequencies within the frequency bandwidth, there is no advantage to its use.

A broadband predistortion equalizer is desired.

SUMMARY OF THE INVENTION

A predistortion equalizer for a signal to be amplified includes a signal processing first channel with an input terminal and an output terminal, and also includes a first signal attenuator coupled to the input terminal of the first channel for attenuating signals applied thereto for producing attenuated first channel signals. The first channel also includes a first signal translation arrangement, such as an amplifier, coupled to the first attenuator and to the output terminal of the first channel for translating or amplifying the attenuated first channel signals. First channel output signals are generated at the output terminal of the first channel, which first channel output signals are substantially linearly related to the amplitudes of the signals applied to the input terminal of the first channel, and which have a reference phase for signals of a particular frequency. A signal processing second channel also includes an input terminal and an output terminal. The second channel also includes a signal translation arrangement or amplifier, which may be similar to the first amplifier, coupled to the input terminal of the second channel for translating signals applied thereto for producing translated second channel signals. The second channel also includes a second signal attenuator coupled to the second signal translation arrangement and to the output terminal of the second channel for attenuating the translated second channel signals to generate second channel signals at the output terminal of the second channel. The second channel output signals have amplitudes which are less linearly related to the amplitudes of the signals applied to the input terminal of the second channel than the linearity of the relationship of the input and output signals of the first channel. Also, the second channel has a phase shift ranging from 90° to 270° relative to the reference phase for signals of the particular frequency. The predistortion equalizer also includes a resistive signal amplitude divider having an input port adapted to be coupled to the source of signals to be amplified, and also includes first and second output terminals. The first output terminal is coupled to the input terminal of the first channel, and the second channel is coupled to the input terminal of the second channel for dividing the power of the signal to be amplified into a first portion for the first channel and a second portion for the second channel. The first and second portions are of substantially equal phase. The predistortion equalizer also includes a resistive signal combiner including first and second input terminals coupled to the output terminals of the first and second channels, respectively. It also includes an output port adapted to be coupled to amplifying means which operates at a level tending to cause distortion. The resistive signal combiner combines the first and second channel output signals without significant additional relative phase shift for generating a predistorted version of the signal to be amplified at the output port of the resistive combiner. The predistorted signal to be amplified is the difference between the signals produced at the output terminals of the first and second channels, and is predistorted, thereby tending to compensate for the distortion of the following amplifier.

DESCRIPTION OF THE INVENTION

Figure 1:
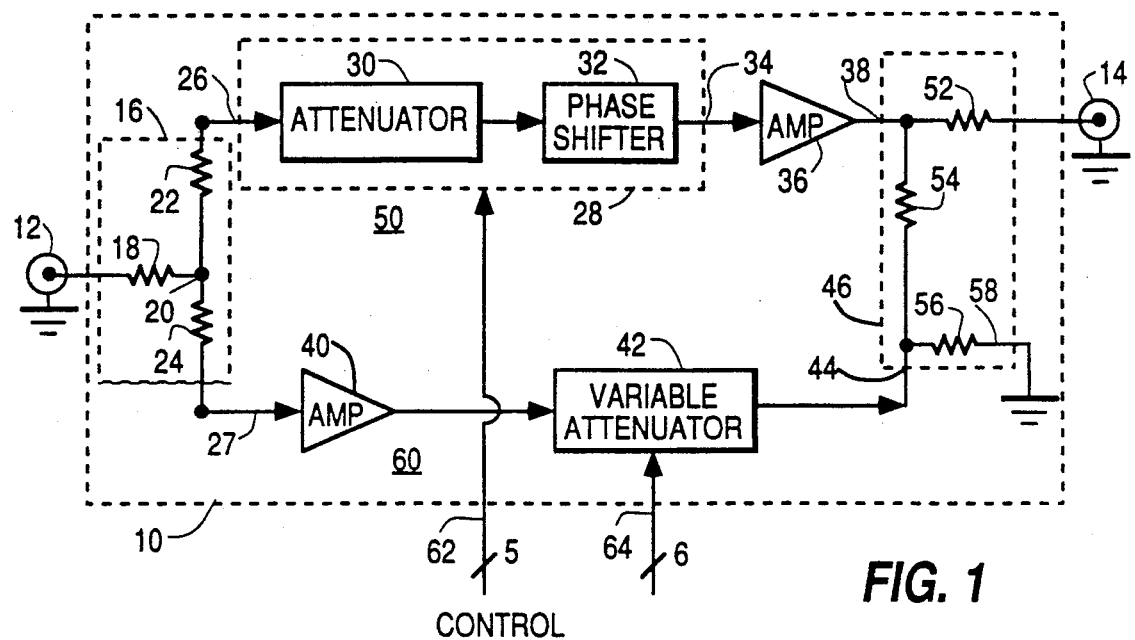
FIG. 1 is a simplified diagram in block and schematic form of a predistortion equalizer according to the invention.

FIG. 1 is a simplified diagram in block and schematic form of a predistortion equalizer adapted for operation at microwave or millimeter-wave (RF) operating frequencies. In FIG. 1, predistortion equalizer 10 includes an input port 12 and an output port 14. Input port 12 is adapted to receive signal from a source (not illustrated) which is to be predistorted by predistortion equalizer 10, and port 14 is adapted to be coupled to an amplifier arrangement (not illustrated) which is operated at a level such that amplitude distortion tends to occur. Such an amplifier might be a travelling-wave tube amplifier or paralleled solid-state amplifier array. Of course, the amplifier arrangement may include final power amplifiers and separate preamplifiers, as appropriate.

Signals to be amplified applied to input port 12 from the source are applied to a first end of a resistor 18, the other end of which is connected to a node 20. One end of each of resistors 22 and 24 are also connected to node 20. Resistors 18, 22 and 24 together form a resistive signal amplitude or power divider illustrated as 16, which accepts signals from input port 12, divides the signal into two equal-amplitude portions, and applies those portions over conductors illustrated as 26 and 27 to the input terminals (not separately designated) of an upper channel 50 and a lower channel 60, respectively. The signals on conductors 26 and 27, in addition to being of equal amplitude, are of equal phase. For purposes of differentiating between "ports" and "terminals" herein, the term "port" connotes an impedance match to a desired characteristic, while "terminals" do not necessarily suggest such an impedance match.

Upper channel 50 is intended to be a linear reference channel and lower channel 60 is intended to be a nonlinear channel. Those skilled in the art know that linearity if a matter of degree, and that upper channel 50 may have nonlinearities.

Upper channel 50 includes a phase shifter illustrated in dotted outline 28. The input of phase shifter 28 is connected to conductor 26 for receiving an input signal from resistive divider 16, for producing a phase-shifted signal on a conductor 34. Phase shifter 28 is controlled by five-bit control signals applied over a data bus 62 from a control source (not illustrated). Phase shifter 28 is inherently lossy, having a nominal loss of about 8 dB, which may vary depending upon the control signal configuration or logic state. The separate functional aspects of phase shifter 28 are illustrated by the cascade of an attenuator block 30 and a phase shifter block 32 within the outline of phase shifter 28. Phase shifter 28 produces phase-shifted and attenuated signals on a conductor 34 for application to an amplifier 36. Amplifier 36 has sufficient output power capability to produce a substantially linear signal on a conductor 38 within its operating input levels.

Lower channel 60 includes an amplifier 40, the input of which is coupled to conductor 27 for receiving a portion of the divided signal from resistive power divider 16. The output of amplifier 40 is coupled to a controllable or variable attenuator illustrated as a block 42, which is controlled by six-bit control signals applied over a data bus 64 from a control source (not illustrated). Amplifier 40 has an amplitude distortion which changes as a function of the signal level applied to its input terminal. Typically, such a distortion manifests itself as a compression at higher signal levels. As is known to those skilled in the art, such compression may be stated in terms of a percent of compression or, in the case of a multichannel input signal, may be stated in terms of a carrier-to-intermodulation distortion. It should particularly be noted that amplifiers 36 and 40 may be similar amplifiers operated at similar bias levels, whereby the difference in linearity or distortion is attributable to the larger input signal applied to the input of amplifier 40 by comparison with that applied to amplifier 36. The amplified signal produced by amplifier 40 is applied by way of variable attenuator 42 to an input terminal 44 of a resistive signal combiner 46. Similarly, the output of amplifier 46 is applied to input terminal 38 of signal combiner 46.

Resistive signal combiner 46 includes a first resistor 52 connected between its input terminal 38 and output port 14. A second resistor 54 has one end connected to input terminal 38, and the other end to input terminal 44. A third resistor 56 is connected between input terminal 44 and a source of reference potential such as ground 58. Resistive combiner 46 combines the relatively nonlinear signal applied to input terminal 44 with the relatively linear signal applied to input terminal 38. Phase shifter 32 is adjusted to create a relative phase shift between the linear and nonlinear signals applied to resistive combiner 46, which phase shift lies within the range of 90° and 270°, and which for ease of understanding may be considered to have a nominal value of 180°, representing an out-phase condition.

The signal voltage appearing at the output of amplifier 36, at the output of the top or upper channel 50 can be represented as $$V_T = V_{in} \cdot A_T \cdot G_T \angle \theta_T + \theta_d \tag{1}$$

where:
$V_{in}$ is the voltage level applied to power divider 16:
AT is the attenuation ratio of power divider 16 together with the inherent attenuation of top or upper channel phase shifter 28, as represented by ideal attenuator 30;
GT is the gain of top channel amplifier 36;
$\theta T$ is the inherent phase shift of the top channel other than that introduced by ideal phase shifter 32; and
$\theta d$ is the phase shift introduced by ideal phase shifter 32 and controlled by the control signal applied over bus 62.

Similarly, the signal voltage VB appearing at the output of bottom or lower channel 60 can be represented as $$VB = V_{in} \cdot GB \cdot AB \angle \theta B \qquad (2)$$

where:
$V_{in}$ is the voltage level applied to power divider 16 from input port 12;
GB is the gain of bottom channel amplifier 40;
AB is the attenuation ratio of power divider 16 together with that of bottom channel attenuator 42; and
$\theta B$ is the inherent phase shift introduced by the bottom channel.

Resistive output signal combiner 46 combines signal VT received at its input terminal 38 with signal VB received at its input terminal 44 to produce an output signal voltage $V_{out}$ at output port 14

$$V_{out} = V_{in}(AT \cdot GT \angle \theta T + \theta d + GB \cdot AB \angle \theta B) \qquad (3)$$

Assuming that the inherent phase shifts of the top and bottom channels are the same, or may be compensated by an additional phase shift introduced by phase shifter 32 so as to be the same, and further assuming that the functional phase shift introduced by phase shifter 32 is $\pi$ or 180°, then $$V_{out} = V_{in}(AT \cdot GT - GB \cdot AB) \qquad (4)$$

and the gain of the predistortion equalizer becomes $$\text{GAIN} = \frac{V_{out}}{V_{in}} = (AT \cdot GT - GB \cdot AB) \qquad (5)$$

Since the top path is assumed to be always linear, the product AT·GT remains constant for all input signal levels. The product GB·AB, however, decreases in magnitude with increasing magnitude of $V_{in}$, as amplifier 40 is driven toward saturation. With increasing input signal level, therefore, progressively less signal is subtracted from AT·GT, and the combined signal at output port 14 has an expanding transfer function or characteristic. An expanding transfer function is the opposite of a compression, and may be useful for predistortion correction.

For values of $\theta d$ ranging from about 90° to 270°, an expanding transfer function characteristic also occurs, but accompanied by an associated change in phase. If $\theta d$ is in the range of 90° to 180°, the phase shift of the output signal increases as a function of input level, while for $\theta d$ in the range of 180° to about 270°, the phase shift of the output signal decreases with increasing signal level. By appropriate selection of phase shift $\theta d$ and the attenuation of attenuator 42, almost any combination of expansion and phase shift may be generated. Naturally, if the increments provided by 5-bit phase shift and 6-bit attenuation are too coarse, a greater number of bits may be used, or analog phase shifters or attenuators may be used.

A major advantage of the embodiment of FIG. 1 lies in the use of resistive signal power divider 16 and resistive signal power combiner 46 instead of by the use of inductively coupled transformers or inductively-capacitively coupled circuits such as directional couplers, which tend to change their coupling factors and phase at frequencies other than the center frequency of the design band. While such changes in coupling factor and phase are small, the differences are magnified or exacerbated due to the fact that signal subtraction, or the difference between the signals in the channels, is used for the output signal.

Ideally, the structure illustrated in FIG. 1 is formed as a monolithic microwave integrated circuit (MMIC) in order to maximize bandwidth and to fully take advantage of the bandwidth improvements provided by the use of resistive dividers and combiners. In a particular embodiment of the invention, resistors 18, 22 and 24 of resistive dividers 16 each have a resistance value of 16.6 ohms, and resistors 52, 54 and 56 of resistive combiner 46 have resistance values of 15, 100 and 68 ohms, respectively. Five-bit digital phase shifter 28 has an inherent attenuation of 8 dB and phase increments of about 5° per step. Six-bit variable attenuator 42 has a range of about +3 to −30 dB, and amplifiers 36 and 40 each have a gain in the range of 6 to 8 dB over a frequency range 11.2 to 11.7 GHz, centered on 11.5 GHz.

Figure 2A:
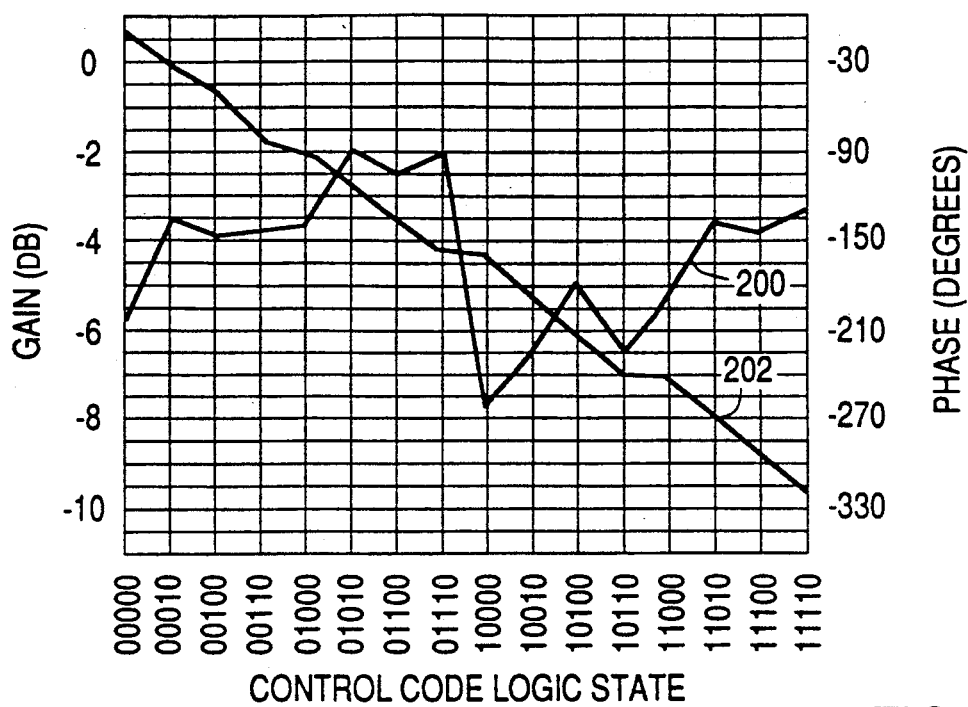
FIG. 2a is a plot of the relative gain and phase of signals traversing the first or linear channel of FIG. 1 for various values of a digital control signal applied to a phase shifter.
Figure 2B:
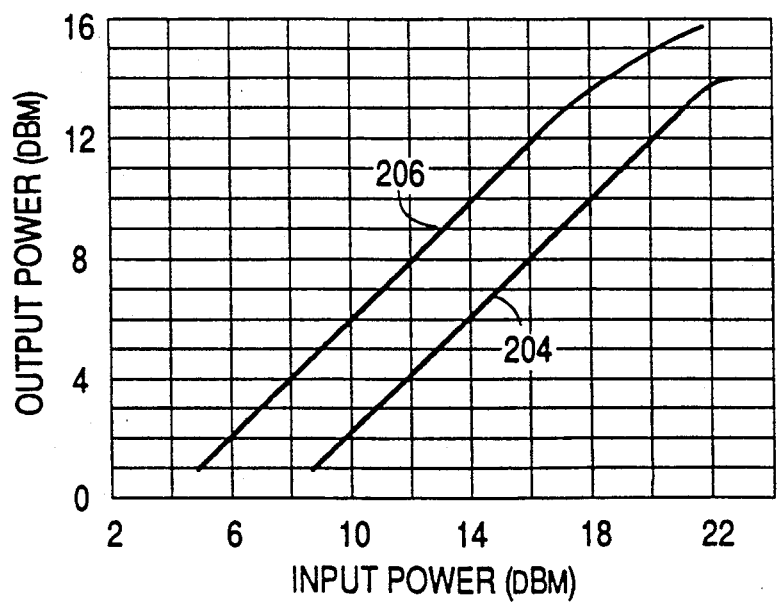
FIG. 2b is a plot of output power of the first channel of FIG. 1 relative to input power.

FIG. 2a illustrates as a plot 200 the gain of linear upper channel 50 as a function of the phase shifter logic state at a frequency of 11.95 Ghz, and plot 202 illustrates the corresponding phase in degrees. FIG. 2b illustrates as a plot 204 the output power in dBm plotted against the input power in dBm for the linear upper channel for a phase shifter logic state of 10000, corresponding roughly to 180° of phase shift. Plot 206 is a corresponding plot for a control code logic state of 00010. The value 10000 corresponds to maximum attenuation of the phase shifter, as can be verified by referring to FIG. 2a. The plot 206 represents a lower loss condition of phase shifter 28 of FIG. 1 than plot 104, and as a result the upper channel has higher gain. As can be seen by comparison of plots 104 and 106, little compression results at higher input power levels.

Figure 3A:
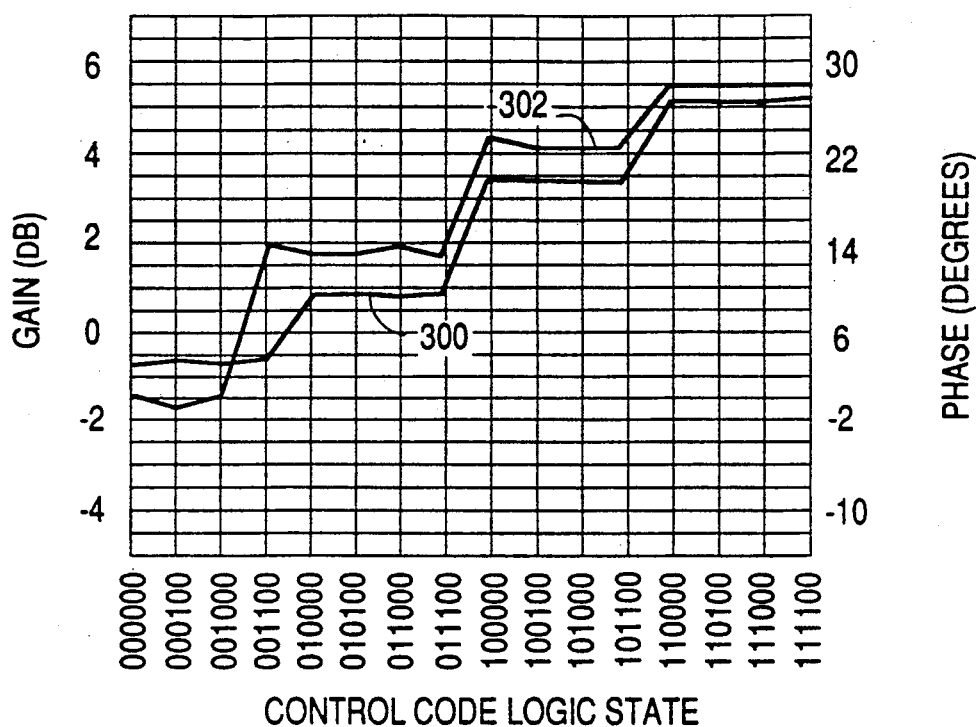
FIG. 3a is a plot of relative gain and phase of a second or nonlinear channel of the arrangement of FIG. 1 at a frequency of 11.95 GHz for various values of a digital control signal applied to a variable attenuator of FIG. 1.
Figure 3B:
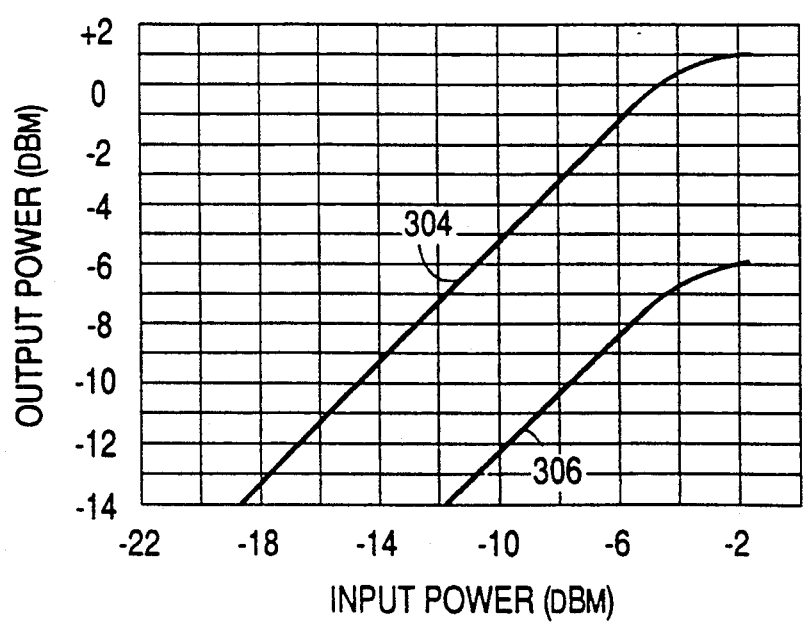
FIG. 3b is a plot of output power versus input power for the second channel of FIG. 1.

Plot 300 of FIG. 3a illustrates the gain of lower channel 60 of FIG. 1 at 11.95 GHz as a function of the logic state of the control code applied over data bus 64 to attenuator 42 of FIG. 1. The gain is maximum (attenuation is least) for codes greater than about 110000. Correspondingly, gain is minimum (attenuation is maximum) for codes near 000000. Plot 302 illustrates the phase in degrees resulting from attenuation control. Plot 304 of FIG. 3b illustrates the output power in dBm relative to input power in dBm for the lower channel 60 of FIG. 1 at a frequency of 11.95 GHz for a logic state of 111100 (minimum attenuation) of the control code applied to variable attenuator 42 of FIG. 1. Plot 304 substantially corresponds to minimum attenuation, and therefore plot 304 represents the maximum gain. The magnitude of the gain may be determined by noting the difference between the input power and the output power for any point on the curve. For example, an input power of −10 dBm provides an output power of about −5 dBm, thereby indicating a gain of 5 dB. Compression or deviation away from a gain of about 5 dB occurs at an input power of about −4 dBm. Plot 306 of FIG. 3b is a corresponding plot for a control input logic state of 000000 (maximum attenuation). With maximum signal attenuation of attenuator 42, at an input power of −10 dBm, output power is about −12 dBm, indicating a gain of −2 dB. Thus, control of attenuator 42 between codes 000000 and 111100 can result in a gain change of lower channel 60 of FIG. 1 of about 7 dB. The onset of compression continues to occur at about −4 dBm of input signal power.

Figure 4A:
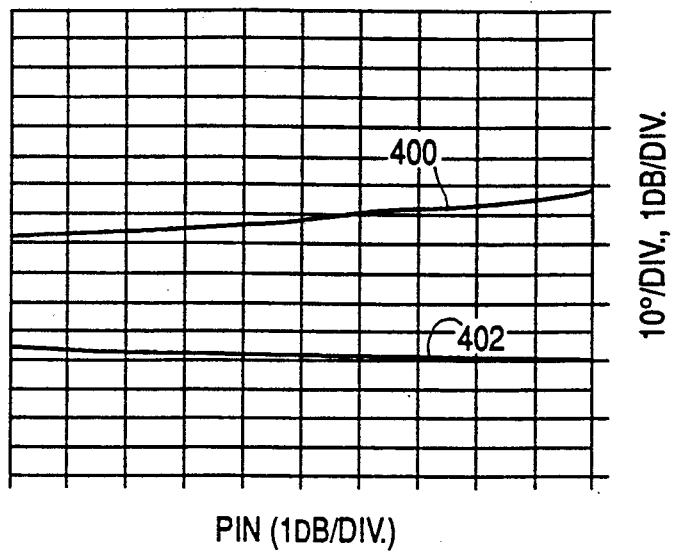
FIGS. 4a, 4b and 4c are plots of the magnitude and phase of the output signal produced by the predistortion equalizer of FIG. 1 at a frequency of 11.95 GHz for particular control signal conditions.
Figure 4B:
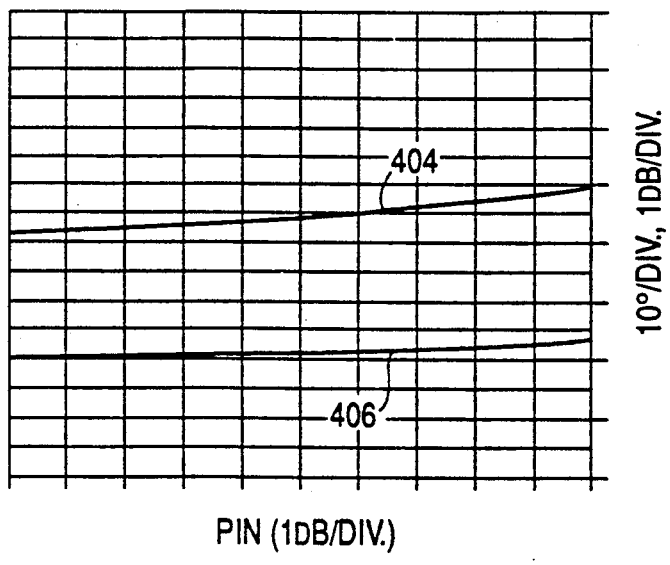
Figure 4C:
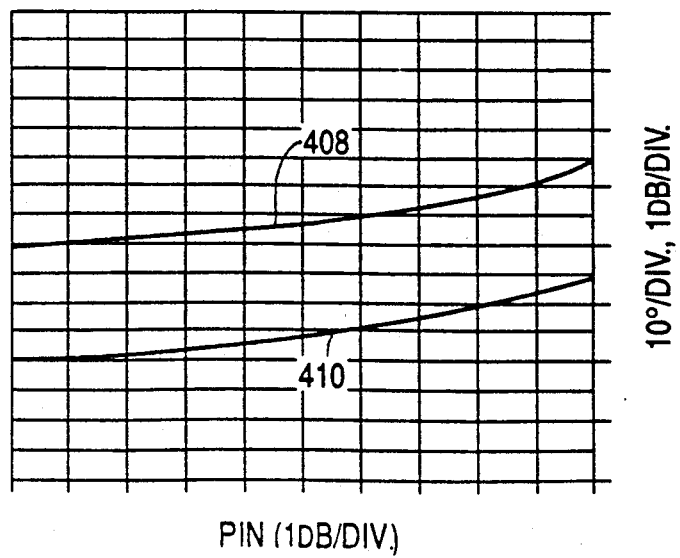

FIGS. 4a, 4b and 4c illustrate plots of magnitude and phase of the transfer function of the arrangement of FIG. 1 between parts 12 and 14 at 11.95 GHz for various control conditions. In FIG. 4a, plot 400 represents the magnitude and plot 402 the phase for a phase shifter control signal of 000111 and an attenuator control signal of 010000. Plot 400 represents a gain expansion of 0.9 dB and a phase lag over the illustrated range of +3°. In FIG. 4b, plot 404 represents the magnitude and plot 406 the phase. For a phase shifter control logic state of 00011 and an attenuator logic state of 010000. This provides a gain expansion of 0.9 dB and a phase lead of 3° across the illustrated range of input signals. In FIG. 4c, plot 408 illustrates the magnitude and plot 410 illustrates the phase across a range of input signal levels with a phase shifter control logic state of 00110 and an attenuator logic state of 110000. The plots of FIG. 4c represent a gain expansion of 1.5 dB and a phase lead of 13° across the illustrated range of input signal levels.

Figure 5:
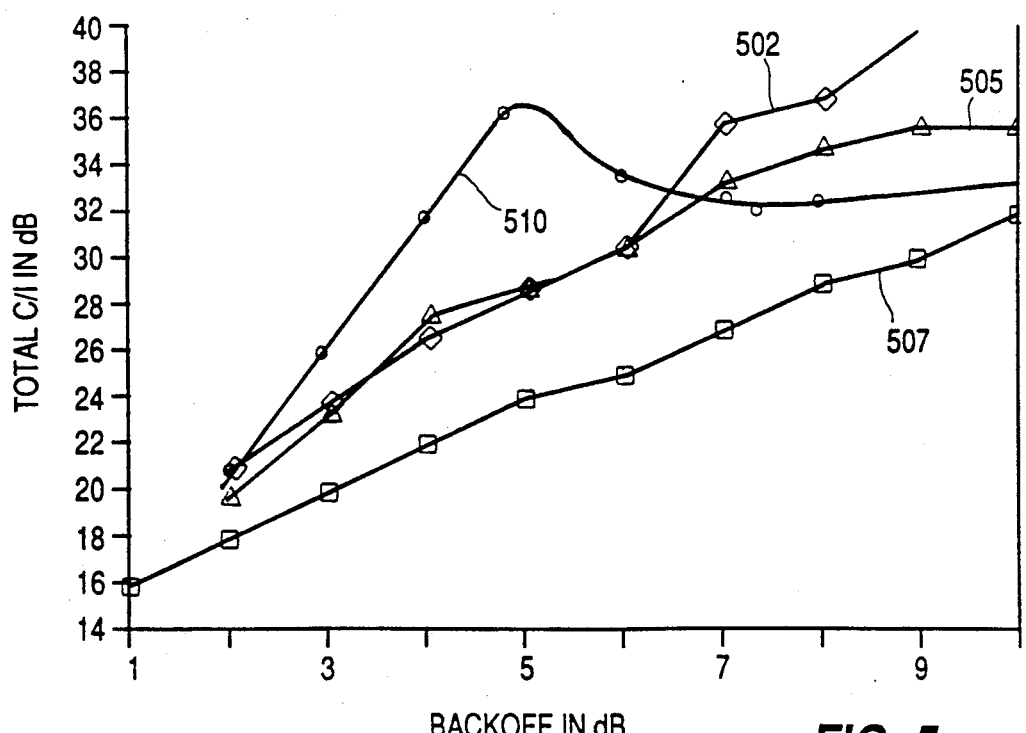
FIG. 5 is a plot illustrating carrier-to-intermodulation ratio at various frequencies for the predistortion equalizer of FIG. 1 cascaded with an amplifier, with a plot of a prior art diode predistortion equalizer for comparison.

In FIG. 5, plots 502, 505 and 507 are made at 11.2, 11.5 and 11.7 GHz, respectively, and represent the carrier-to-intermodulation (C/I) distortion in dB occurring at those three frequencies for various amounts of backoff from maximum power level of a combination of the predistortion equalizer of FIG. 1 and a particular following power amplifier. At maximum output power, corresponding to low values of backoff, the distortion is in the range of 16 to 20 dB below the desired signal carrier level. As backoff increases to about 10 dB, the distortion decreases in a roughly monotonic manner to the range of 32 to 40 dB. The three plots 502, 505 and 507 are approximately parallel, indicating that at all frequencies in the frequency range of interest the change in distortion level as a function of backoff is predictable. Plot 510 of FIG. 5 represents the best of the results at one of 11.2, 11.5 and 11.7 GHz for a prior art diode linearizer utilizing hybrid couplers. Plot 510 is not monotonic, and does not achieve as good a result as the arrangement of the invention for certain frequencies and backoff levels.

Other embodiments of the invention will be apparent to those skilled in the art. The values of the resistors used in resistive dividers and combiners according to the invention will depend upon the characteristic impedances of the ports to which they are intended to be coupled, and upon the power division. For example, top channel 50 may be made more linear and bottom channel 60 more nonlinear by increasing the resistance of resistor 22 by comparison with that of resistor 24. Similarly, resistive combiner 46 presents attenuation between its input port 44 and its input port 48, which may be traded against the resistance of variable attenuator 42.

While the resistive power combiner nominally introduces no phase shift, it is asymmetrical as to the two signal paths and therefore actually introduces some residual phase shift, which is not considered significant in view of the phase shift linearity errors in the controllable attenuator and phase shifter. The distortion errors manifest themselves in many ways, and the exact nature of the distortion manifestation is not considered important, as for example in some multichannel television application the distortion manifestation known as "cross-modulation" may be more important than either intermodulation distortion or compression. Connection ports have been described as impedance-matched, but those skilled in the art know that such "matches" are ideal, and in practice are subject to wide variations ordinarily known or specified by VSWR, return loss, or $S_{11}$.

What is claimed is:

1. A predistortion equalizer for signal to be predistorted comprising:

a signal processing first channel including an input terminal and an output terminal, and including first signal attenuation means coupled to said input terminal of said first channel for attenuating signals applied thereto for producing attenuated first channel signals, and first signal translation means coupled to said first attenuation means and to said output terminal of said first channel for translating said attenuated first channel signals for generating first channel output signals at said output terminal of said first channel, which first channel output signals have amplitudes which are substantially linearly related to the amplitudes of the signals applied to said input terminal of said first channel, said first channel having a reference phase for signals of a particular frequency passing therethrough;

a signal processing second channel including an input terminal and an output terminal, and including second signal translation means coupled to said input terminal of said second channel for translating signals applied thereto for producing translated second channel signals, and second signal attenuation means coupled to said second signal translating means and to said output terminal of said second channel for attenuating said translated second channel signals and for generating second channel output signals at said output terminal of said second channel, which second channel output signals have amplitudes which are less linearly related to the amplitudes of the signals applied to said input terminal of said second channel than the linearity of the relationship of said input and output signals of said first channel, said second channel having a phase ranging from 90° to 270° relative to said reference phase for signals of said particular frequency passing therethrough;

resistive signal dividing means including an input port adapted to be coupled to a source of said signal to be predistorted and also including first and second output terminals, said first output terminal being coupled to said input terminal of said first channel and said second output terminal being coupled to said input terminal of said second channel, for dividing the power of said signal to be predistorted into a first portion for said first channel and a second portion for said second channel, said first and second portions being of substantially equal phase; and resistive signal combining means including first and second input terminals coupled to said output terminals of said first and second channels, respectively, and also including an output port adapted to be coupled to amplifying means operating at a level tending to cause distortion, for combining said first and second channel output signals for generating a predistorted signal at said output port of said resistive combining means, which predistorted signal is the difference between said first and second channel output signals, for tending to compensate for said distortion of said amplifying means.

2. An equalizer according to claim 1, wherein one of said first and second signal translation means comprises a first signal amplifier.

3. An equalizer according to claim 2, wherein the other one of said first and second signal translation means comprises a second signal amplifier.

4. An equalizer according to claim 3 wherein said first and second signal amplifiers are identical.

5. An equalizer according to claim 1 further comprising phase shifting means coupled in one of said first and second channels.

6. An equalizer according to claim 1 wherein at least a portion of said first signal attenuation means is an inherent characteristic of a phase shifting means.

7. An equalizer according to claim 1 wherein said resistive signal dividing means comprises a node and first, second and third resistance means, said third resistance means being coupled between said node and said input port of said resistive signal dividing means, said first resistance means being coupled between said node and said first output terminal of said resistive signal dividing means, and said second resistance means being coupled between said node and said second output terminal of said resistive signal dividing means.

8. An equalizer according to claim 7 wherein said first, second and third resistance means have resistances which are equal in value.

9. An equalizer according to claim 8 wherein said value is about 17 ohms.

10. An equalizer according to claim 1 wherein said resistive signal combining means comprises first, second and third resistance means, said first resistance means being coupled between said first input terminal of said resistive signal combining means and said output port of said resistive signal combining means, said second resistance means being coupled between said first and second input terminals of said resistive signal combining means, and said third resistance means being coupled between said second input terminal of said resistive signal combining means and a point of reference potential.

11. An equalizer according to claim 10 wherein the value of the resistance of said first resistance means is 15 ohms, the value of the resistance of said third resistance means is 68 ohms, and the value of the resistance of said second resistance means is 100 ohms.

12. An equalizer according to claim 1 wherein said first and second signal processing channels are formed as integrated circuits.

13. A method for producing predistorted signals, comprising the steps, over a frequency of interest, of:
   resistively dividing into first and second portions the signals to be predistorted;
   passing said first portion of said signals through a first channel having reference phase shift and also having reference magnitude, to produce first channel output signals;
   passing said second portion of said signals through a second channel having phase shift equal to said reference phase plus a further phase shift having a value in the range of 90° to 270° and also having magnitude which is nonlinearly related to the magnitude of said second portion of said signals to be predistorted, to produce second channel output signals; and
   resistively combining said first and second channel output signals for generating said predistorted signals.

14. A predistortion equalizer for a signal to be predistorted, comprising:
   a substantially linear channel;
   a substantially nonlinear channel;
   resistive dividing means for dividing said signal to be predistorted into a first portion and a second portion;
   first coupling means coupled to said resistive dividing means and to said first and second channels for coupling said first portion to said first channel and said second portion to said second channel, whereby said first channel produces a substantially linear signal and said second channel produces a nonlinear signal;
   resistive combining means including first and second input terminals and an output port for combining signals applied to said first and second input terminals to produce a combined signal at said output port; and
   second coupling means coupled to said first and second channels and to said first and second input terminals of said resistive combining means for coupling said substantially linear signal to said first input terminal of said resistive combining means and said nonlinear signal to said second input terminal of said resistive combining means for combining said linear and substantially nonlinear signals to produce a predistorted signal.

* * * * *